(12) United States Patent
Johnson (10) Patent No.: US 6,798,801 B2
(45) Date of Patent: Sep. 28, 2004

(54) PUMP LASER CURRENT DRIVER

(75) Inventor: Ronald E. Johnson, Pasadena, MD (US)

(73) Assignee: Dorsal Networks, Inc., Columbia, MD (US)

( * ) Notice: Subject to any disclaimer, the term of this patent is extended or adjusted under 35 U.S.C. 154(b) by 0 days.

(21) Appl. No.: 09/969,154

(22) Filed: Oct. 3, 2001

(65) Prior Publication Data

US 2003/0063641 A1 Apr. 3, 2003

(51) Int. Cl.$^7$ .................................................. H01S 3/00
(52) U.S. Cl. .............................. 372/38.02; 372/38.04
(58) Field of Search ........................ 372/38.1, 38.01, 372/29.012, 29.015, 38.02, 38.04, 38.07

(56) References Cited

U.S. PATENT DOCUMENTS

| | | | | |
|---|---|---|---|---|
| 3,705,992 A | | 12/1972 | Ippen et al. ............... 307/88.3 |
| 4,400,812 A | * | 8/1983 | Clark et al. .................... 372/29 |
| 4,401,364 A | | 8/1983 | Mochizuki ............... 350/96.16 |
| 4,616,898 A | | 10/1986 | Hicks, Jr. ................. 350/96.15 |
| 4,805,977 A | | 2/1989 | Tamura et al. ........... 350/96.16 |
| 5,459,328 A | * | 10/1995 | Kadota et al. ............... 250/551 |
| 5,530,936 A | * | 6/1996 | Harasawa ..................... 372/38 |
| 5,604,759 A | * | 2/1997 | Miyaki et al. ................ 372/38 |
| 5,736,881 A | * | 4/1998 | Ortiz ........................... 372/175 |
| 5,920,423 A | | 7/1999 | Grubb et al. ............... 359/341 |
| 6,031,855 A | * | 2/2000 | Watanabe ..................... 372/38 |
| 6,061,378 A | * | 5/2000 | Marshall et al. .............. 372/75 |
| 6,137,816 A | * | 10/2000 | Kiinbara ....................... 372/38 |
| 6,259,714 B1 | * | 7/2001 | Kinbara ................... 372/38.02 |
| 6,292,288 B1 | | 9/2001 | Akasaka et al. ............ 359/334 |

OTHER PUBLICATIONS

AT&T Technical Journal: A Journal of the AT&T Companies, vol. 74, No. 1, Jan./Feb. 1995, 106 pages.

* cited by examiner

*Primary Examiner*—Don Wong
*Assistant Examiner*—Phillip Nguyen
(74) *Attorney, Agent, or Firm*—Harrity & Snyder, LLP (57) ABSTRACT

A laser system includes a series coupled laser diode pair, first and second current regulators, and a power supply. The first current regulator controls current supplied to the laser diode pair. The second current regulator selectively diverts a portion of the supplied current away from a first laser diode of the laser diode pair. The power supply adaptively adjusts a level of a supply voltage applied across the series coupled laser diode pair.

42 Claims, 8 Drawing Sheets

PUMP LASER CURRENT DRIVER

FIELD OF THE INVENTION

The present invention relates generally to lasers employed in optical transmission systems and, more particularly, to current drivers for powering lasers in optical transmission systems.

BACKGROUND OF THE INVENTION

Figure 1:
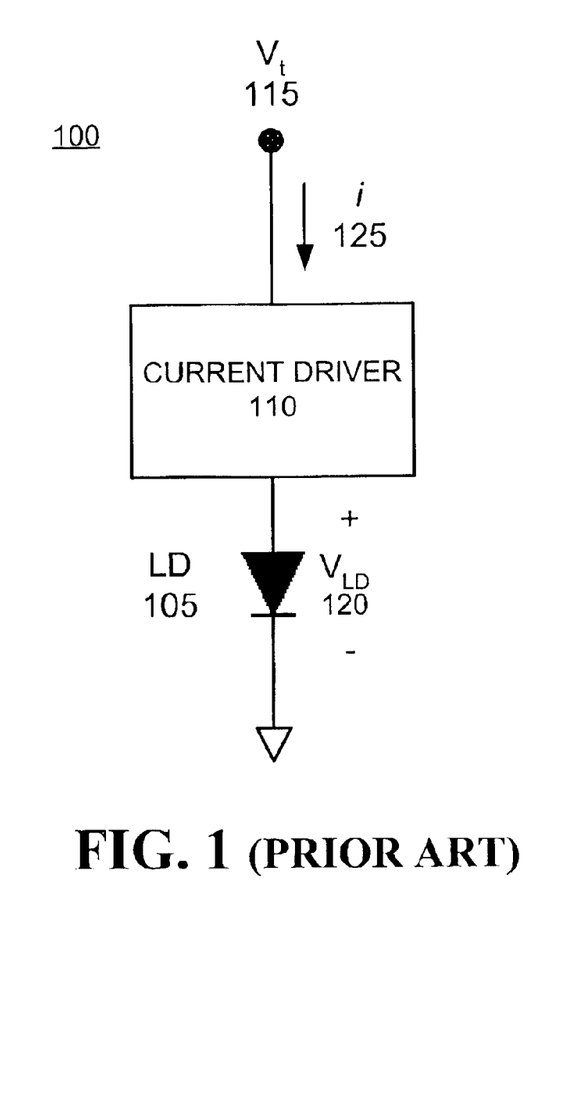
FIG. 1 illustrates a conventional pump laser system.

Pump lasers are conventionally used in many different types of optical transmission systems. In such systems, pump lasers may, for example, be employed in fiber amplifiers (e.g., Raman amplifiers or erbium-doped fiber amplifiers) for amplifying input optical signals. As shown in FIG. 1, a conventional pump laser system 100 may include a laser diode LD 105 that is driven by a current driver 110. Fixed supply voltage $V_t$ 115 further powers current driver 110. Inherent variations in the characteristics of each laser diode 105 used in pump laser system 100 can cause significant variations in the level of current and applied voltage that is required to produce a given optical output power.

Due to these inherent variations, the voltage level of fixed supply voltage $V_t$ 115 is conventionally selected based on the least possible efficient laser diode 105 that may be used in pump laser system 100. Thus, for any given laser diode 105 used in pump laser system 100, current driver 110 adjusts the laser diode voltage $V_{LD}$ 120 to produce the current i 125 required by the laser diode 105 to output a specific optical power. Since supply voltage $V_t$ 115 is fixed, the remaining voltage that is not dropped across laser diode 105 to produce the specific output power will be dropped across current driver 110. This voltage dropped across current driver 110 represents power that is wasted to produce a specific output power from laser diode 105. In practical laser systems, which may employ numerous laser diodes and associated current drivers, the multiplicative effect of this wasted power can be substantial, and may represent a significant portion of the power consumed by the overall system.

Therefore, there exists a need for systems and methods for reducing the quantity of power consumed by current drivers that drive optical transmission system laser diodes.

SUMMARY OF THE INVENTION

Systems and methods consistent with the present invention address this need and others by providing a current driver that includes current regulation circuitry for controlling each of the laser diodes of a series coupled laser diode pair. In one exemplary embodiment, at least one of the current regulators may increase or decrease the supply of current to one of the laser diodes by selectively diverting the current to a circuit path that may be connected in parallel to the respective laser diode. In other embodiments, one of the current regulators may adaptively control the voltage level of a power supply that powers both of the laser diodes. The power supply, thus, may supply only the minimum amount of voltage necessary to obtain a given optical output from the laser diodes. Operation of the current regulators, consistent with the present invention, advantageously serves to reduce the overall power consumed by the current driver as compared to conventional laser diode current drivers.

In accordance with the purpose of the invention as embodied and broadly described herein, a laser system includes first and second laser diodes coupled in series, and a power supply configured to adaptively adjust a voltage across the first and second laser diodes based on a current through at least one of the first and second laser diodes.

In another implementation consistent with the present invention, a laser system includes a power supply configured to supply current to a first laser diode, a first circuit path including the first laser diode, and a second circuit path configured to selectively divert current from the first circuit path to decrease the supply of current to the first laser diode.

In a further implementation consistent with the present invention, a laser system includes a series coupled laser diode pair, a first current regulator configured to control current supplied to the laser diode pair, a second current regulator configured to selectively divert a portion of the supplied current away from a first laser diode of the laser diode pair; and a power supply configured to adaptively adjust a level of a supply voltage applied across the series coupled laser diode pair.

In yet another implementation consistent with the present invention, a method of powering a laser system includes applying a supply voltage across first and second series coupled laser diodes, and adaptively adjusting a level of the supply voltage based on a current through at least one of the first and second laser diodes.

In a further implementation consistent with the present invention, a method of powering a laser system includes supplying a current to a first circuit path including a laser diode, and selectively diverting a portion of the current from the first circuit path to a second circuit path to decrease the current supplied to the laser diode.

BRIEF DESCRIPTION OF THE DRAWINGS

The accompanying drawings, which are incorporated in and constitute a part of this specification, illustrate an embodiment of the invention and, together with the description, explain the invention. In the drawings.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Systems and methods consistent with the present invention provide mechanisms for reducing an overall power consumed by current drivers in optical transmission systems. Through adaptive control of a voltage level of the power supply that powers laser diodes in the system, a minimum amount of voltage necessary to obtain a given optical output from the laser diodes may be utilized.

Exemplary System

Figure 2:
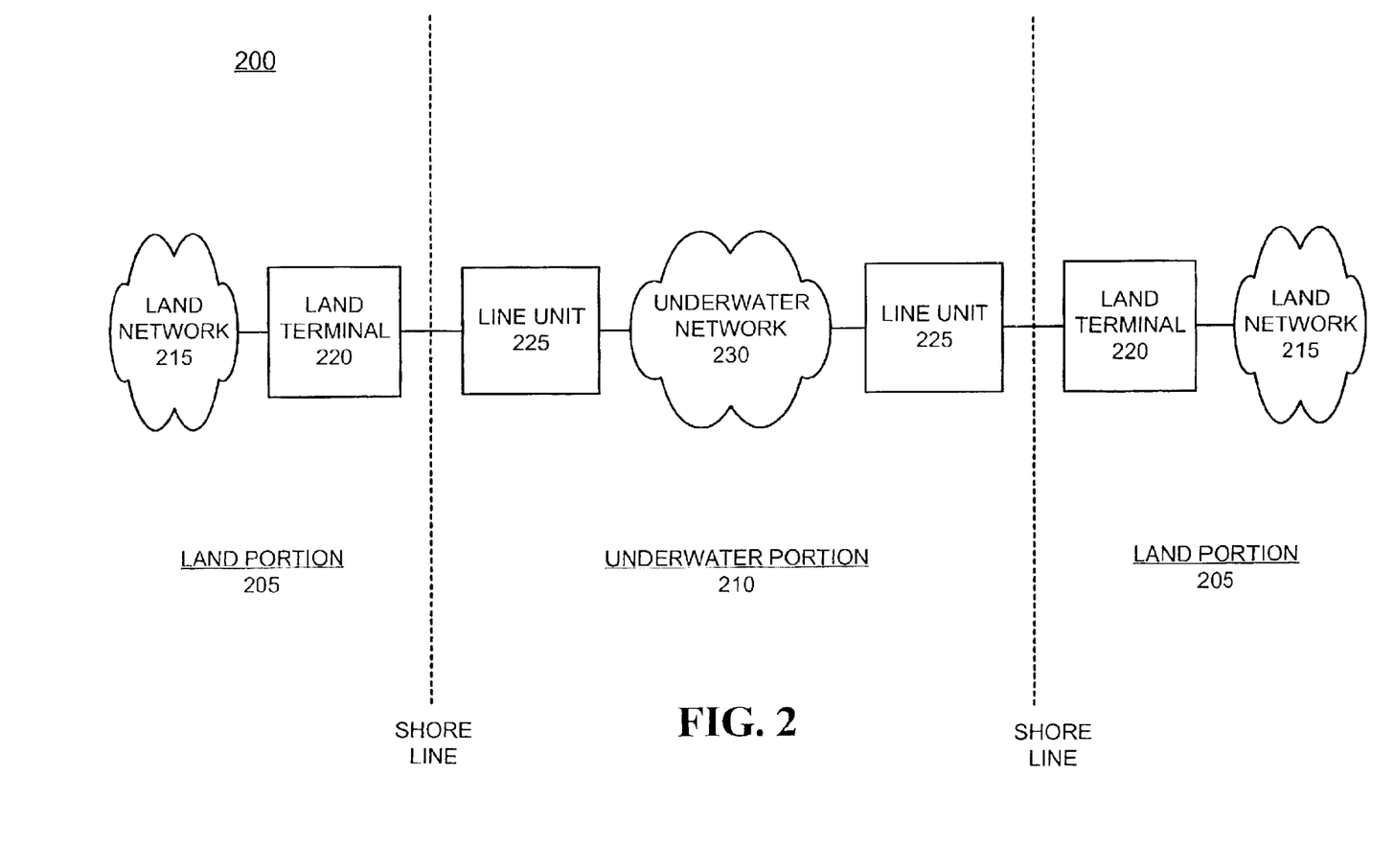
FIG. 2 illustrates an exemplary system in which systems and methods consistent with the present invention may be implemented.

FIG. 2 illustrates an exemplary system 200 in which systems and methods consistent with the present invention may be implemented. System 200 may include two land communication portions 205 that are interconnected via an underwater communication portion 210. The land portions 205 may include land networks 215 and land terminals 220. The underwater portion 210 may include line units 225 (sometimes referred to as "repeaters") and an underwater network 230. Two land networks 215, land terminals 220, and line units 225 are illustrated for simplicity. System 200 may include more or fewer devices and networks than are illustrated in FIG. 2.

Land network 215 may include one or more networks of any type, including a Public Land Mobile Network (PLMN), Public Switched Telephone Network (PSTN), local area network (LAN), metropolitan area network (MAN), wide area network (WAN), Internet, or Intranet. The one or more PLMNs may further include packet-switched sub-networks, such as, for example, General Packet Radio Service (GPRS), Cellular Digital Packet Data (CDPD), and Mobile IP sub-networks. Land terminals 220 include devices that convert signals received from the land network 215 into optical signals for transmission to the line unit 225, and vice versa. The land terminals 220 may connect to the land network 215 via wired, wireless, or optical connections. In an implementation consistent with the present invention, the land terminals 220 connect to the line units 225 via an optical connection.

The land terminals 220 may include, for example, long reach transmitters/receivers that convert signals into an optical format for long haul transmission and convert underwater optical signals back into a format for transmission to the land network 215. The land terminals 220 may also include wave division multiplexers and optical conditioning units that multiplex and amplify optical signals prior to transmitting these signals to line units 225, and line current equipment that provides power to the line units 225 and underwater network 230.

The underwater network 230 may include groups of line units and/or other devices capable of amplifying and routing optical signals in an underwater environment. The line units 225 include devices capable of receiving optical signals and transmitting these signals to other line units 225 via the underwater network 230. The line units 225 may include wave division multiplexers and optical conditioning units that multiplex and amplify received optical signals prior to re-transmitting these signals via underwater network 230.

Exemplary Line Unit

Figure 3:
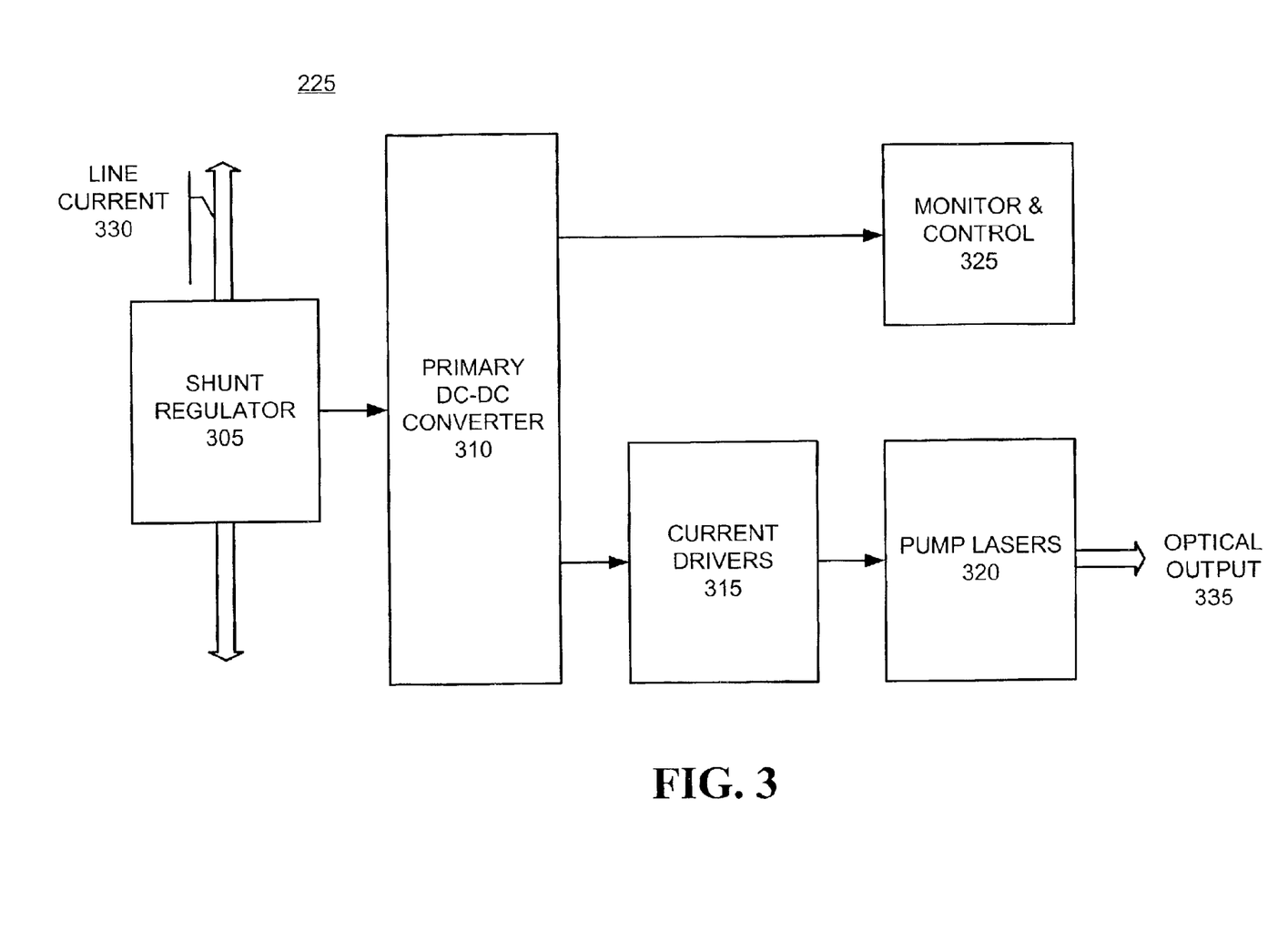
FIG. 3 illustrates a first exemplary line unit consistent with the present invention.

FIG. 3 illustrates a block diagram of a first exemplary line unit 225 consistent with the present invention. Line unit 225 may include a shunt regulator 305, a primary DC-DC converter 310, current drivers 315, and pump lasers 320. Shunt regulator 305 may regulate and shunt a portion of line current 330 to line unit 225. Primary DC-DC converter 310 may provide DC power to current drivers 315 and monitor control circuitry 325. Current drivers 315 may control the supply of voltage and current to pump lasers 320, consistent with the present invention, so as to reduce the power consumed by the current drivers. Pump lasers 320 provide an optical output 335 according to the current and voltage supplied by current drivers 315. Monitor and control circuitry 325 monitors the operation of the components of line unit 225.

Exemplary Current Driver

Figure 4:
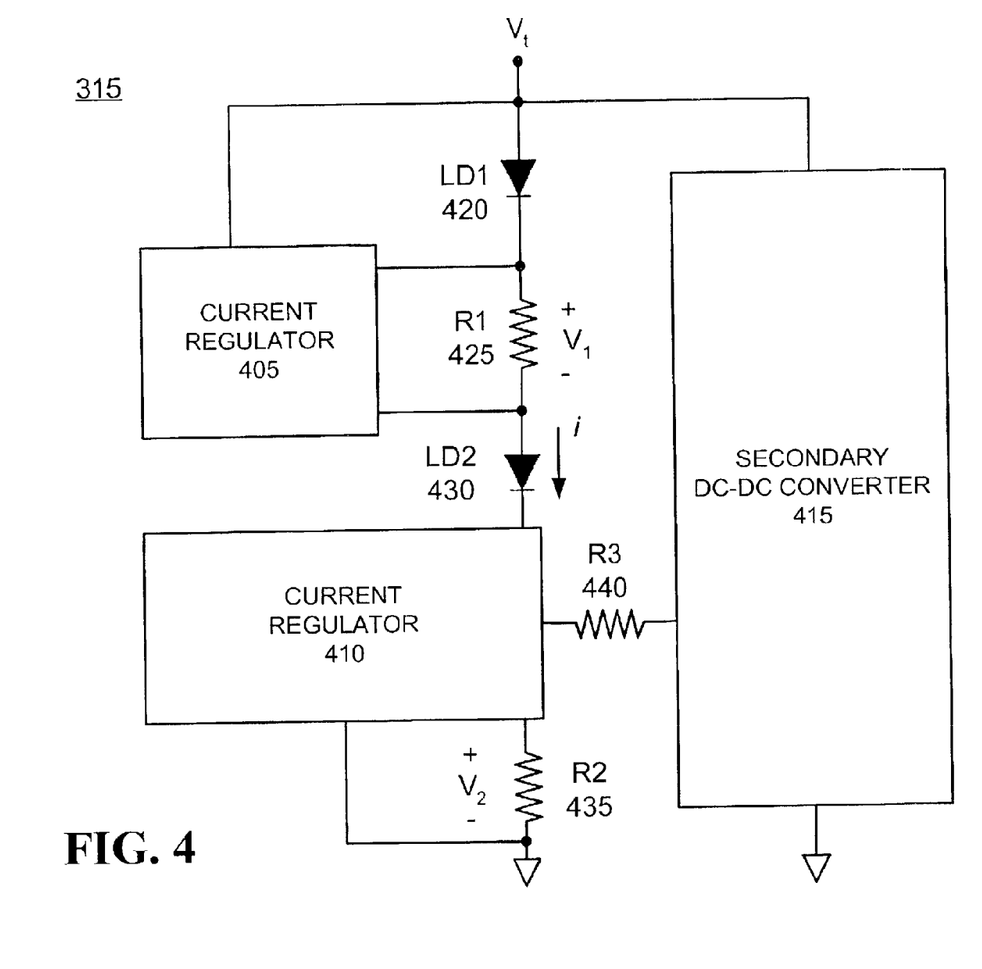
FIG. 4 is a block diagram of a first exemplary current driver consistent with the present invention.

FIG. 4 illustrates a block diagram of an exemplary current driver 315 consistent with the present invention. Current driver 315 may include current regulators 405 and 410 and secondary DC-DC converter 415. Current driver 335 adaptively supplies voltage $V_t$ and current i to laser diode LD1 420, resistor R1 425, laser diode LD2 430 and resistor R2 435 of pump lasers 320. Current regulator 410 sets a nominal current through laser diodes LD1 420 and LD2 430 according to a voltage $V_2$ dropped across resistor R2 435. Current regulator 405 adjusts the current through laser diode LD1 420 according to a voltage $V_1$ dropped across resistor R1 425. Current regulator 410 further supplies a control voltage, via resistor R3 440, to adjust the DC-DC converter 415 output voltage $V_t$ based on the current supplied to laser diode LD2 430. Operation of current regulators 405 and 410 is further described with respect to FIG. 5 below.

Exemplary Current Regulators

Figure 5:
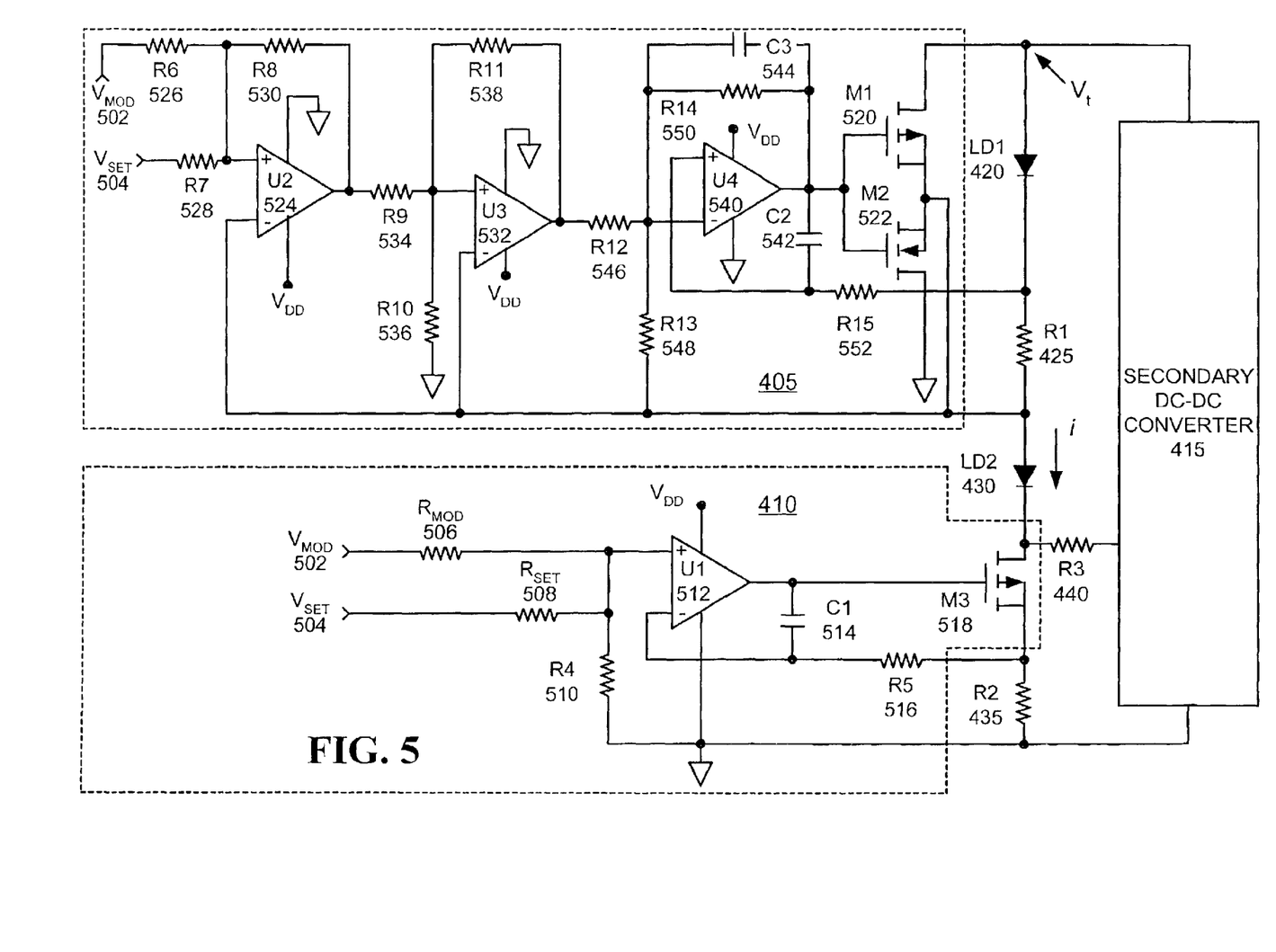
FIG. 5 illustrates exemplary components of the current driver of FIG. 4 consistent with the present invention.

FIG. 5 illustrates exemplary components of current regulators 405 and 410 of current driver 315 according to an implementation consistent with the present invention. Current driver 315 includes voltage inputs $V_{MOD}$ 502 and $V_{SET}$ 504 that provide voltages to current regulators 405 and 410. Voltage input $V_{MOD}$ 502 provides the excitation voltage for modulating the current supplied to laser diodes LD1 420 and LD2 430 and, thus, modulating the laser diode optical output. Voltage input $V_{SET}$ 504 sets a nominal current through laser diodes LD1 420 and LD2 430. Values for $V_{SET}$ 504 can, for example, be received by line unit 225 from one of the land terminals 220, e.g., via a supervisory channel, to set the baseline output for a given laser diode. Likewise, values for $V_{MOD}$ 502 can be set to modulate the pump laser power in order to send information to the land terminals 220, e.g., in response to a command therefrom to measure the actual output laser power of a laser diode. Exemplary methods and systems for providing such supervisory signaling can be found in commonly-assigned, co-pending U.S. patent application Ser. No. 09/927,439, entitled "Redundant Line Unit Monitoring Architecture," to John Mellert et al., filed on Aug. 13, 2001, the disclosure of which is incorporated herein by reference.

Voltages $V_{MOD}$ 502 and $V_{SET}$ 504, when applied to current regulator 410, can be divided across a divider network that includes resistors $R_{MOD}$ 506, $R_{SET}$ 508, and R4 510. The output of the divider network may be applied to a controlled feedback amplifier that may include op-amp U1 512, capacitor C1 514, and resistor R5 516. The output of the controlled feedback amplifier may control p-channel MOSFET transistor M3 518, which in turn, can set a nominal current supplied by DC-DC converter 415 through the series connected laser diodes LD1 420 and LD2 430.

Voltages $V_{MOD}$ 502 and $V_{SET}$ 504 may, in current regulator 405, be applied to a series of amplifiers that control p and n-channel MOSFET transistors M1 520 and M2 522 based on feedback voltages measured at either side of resistor R1 425. The series of amplifiers may include a first amplifier that includes op-amp U2 524 and resistors R6 526, R7 528, and R8 530; a second amplifier that includes op-amp U3 532 and resistors R9 534, R10 536 and R11 538; and a third amplifier that includes op-amp U4 540, capacitors C2 542 and C3 544, and resistors R12 546, R13 548, R14 550, and R15 552. The output of the last amplifier of the series can be applied to the gates of transistors M1 520 and M2 522 to adjust the amount of current supplied to laser diode LD1 420 by DC-DC converter 415. As either of the voltages $V_{MOD}$ 502 or $V_{SET}$ 504 increase (with the other voltage held constant), the output of the series of amplifiers will turn on transistor M1 520 and turn off transistor M2 522, thus, diverting current supplied by DC-DC converter 415 away from laser diode LD1 420 through transistor M1 520. As either of the voltages $V_{MOD}$ 502 or $V_{SET}$ 504 decrease (with the other voltage held constant), the output of the series of amplifiers will turn off transistor M1 520 and turn on transistor M2 522, thus, increasing the amount of current supplied to laser diode LD1 420 by reducing the amount of current diverted through transistor M1 520.

The output voltage $V_t$ of DC-DC converter 415 may be controlled by the voltage on the source of transistor M3 518 that is supplied via resistor R3 440. DC-DC converter 415 may adjust the output voltage $V_t$ based on the voltage received via resistor R3 440 and, thus, reduce the voltage dropped by current regulators 405 and 410 and decrease the overall power consumed by current driver 335.

Exemplary Line Unit

Figure 6:
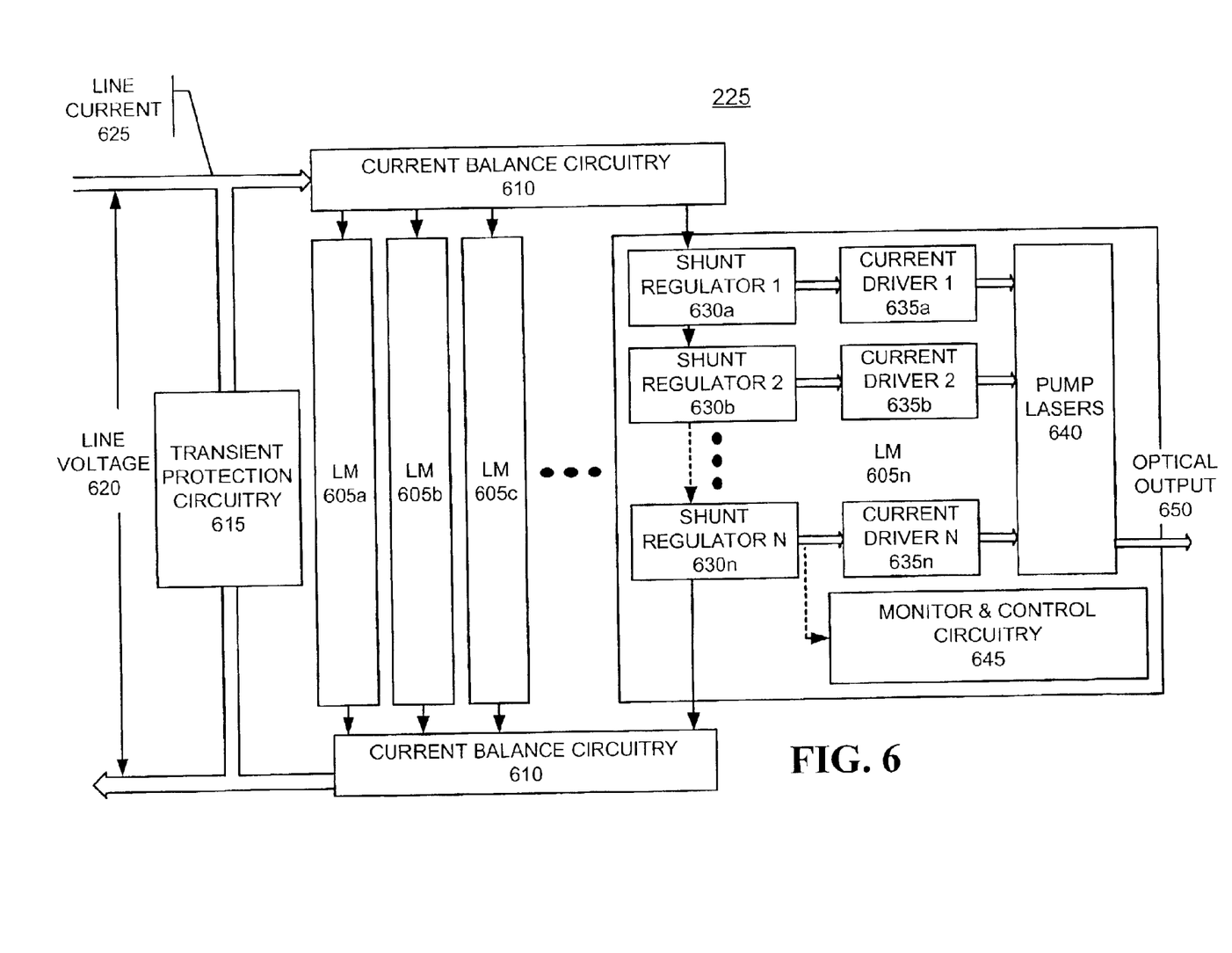
FIG. 6 illustrates a second exemplary line unit consistent with the present invention.

FIG. 6 illustrates a block diagram of a second exemplary line unit 225 consistent with the present invention. Line unit 225 may include one or more laser modules (LM) 605a–605n that may be interconnected with current balance circuitry 610. Current balance circuitry 610 may control the balancing of current supplied to each of the laser modules 605a–605n. Current balance circuitry 610 may further be connected to transient protection circuitry 615. A line voltage 620 may be connected across transient protection circuitry 615 and current balance circuitry 610 for supplying a line current 625 to power line unit 225. Transient protection circuitry 615 includes conventional circuitry for protecting line unit 225 from excessive transient voltages applied at line voltage 620.

Each laser module 605–605n may include one or more adaptive voltage shunt regulators 630a–630n, one or more current drivers 635a–635n, pump lasers 640, and monitor and control circuitry 645. Shunt regulators 630a–630n may supply an adaptive DC voltage to each of the current drivers 635a–635n and, thus, reduce the power consumed by the current drivers. Current drivers 635a–635n supply current to pump lasers 640, consistent with the present invention, so as to control the current through the laser diodes of pump lasers 640. Pump lasers 640 provide an optical output 650 according to the current and voltage supplied by current drivers 635a–635n. Monitor and control circuitry 645 monitors the operation of the components of laser module 605.

Exemplary Current Driver

Figure 7:
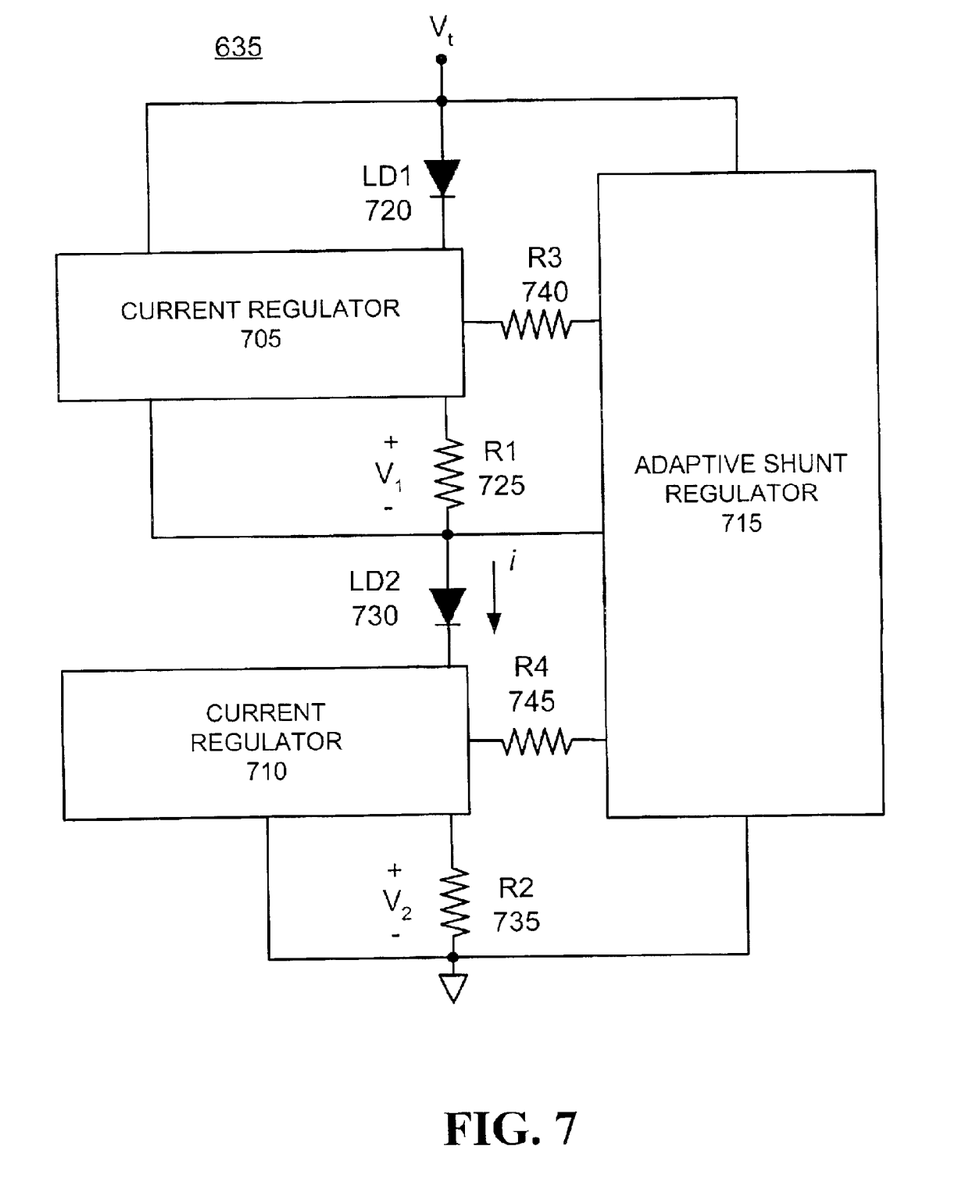
FIG. 7 is a block diagram of a second exemplary current driver consistent with the present invention.

FIG. 7 illustrates a block diagram of an exemplary current driver 635 consistent with the present invention. Current driver 635 may include current regulators 705 and 710 and adaptive shunt regulator 715. Current driver 635 controls the supply of current i to laser diode LD1 720, resistor R1 725, laser diode LD2 730 and resistor R2 735 of pump lasers 640. Current regulator 710 sets a nominal current through laser diode LD2 730 according to a voltage $V_2$ dropped across resistor R2 735. Current regulator 705 sets a nominal current through resistor R1 725 of pump lasers 640 according to a voltage $V_1$ dropped across resistor R1 725. Current regulators 705 and 710 further supply voltages, via resistors R3 740 and R4 745, to control adaptive shunt regulator 715.

Adaptive shunt regulator 715 further adjusts the supply of current to laser diodes LD1 720 and LD2 730 and, thus, the voltages dropped across each of the respective laser diodes. Operation of current regulators 705 and 710 and adaptive shunt regulator 715 is further described with respect to FIG. 8 below.

Exemplary Current Regulators

Figure 8:
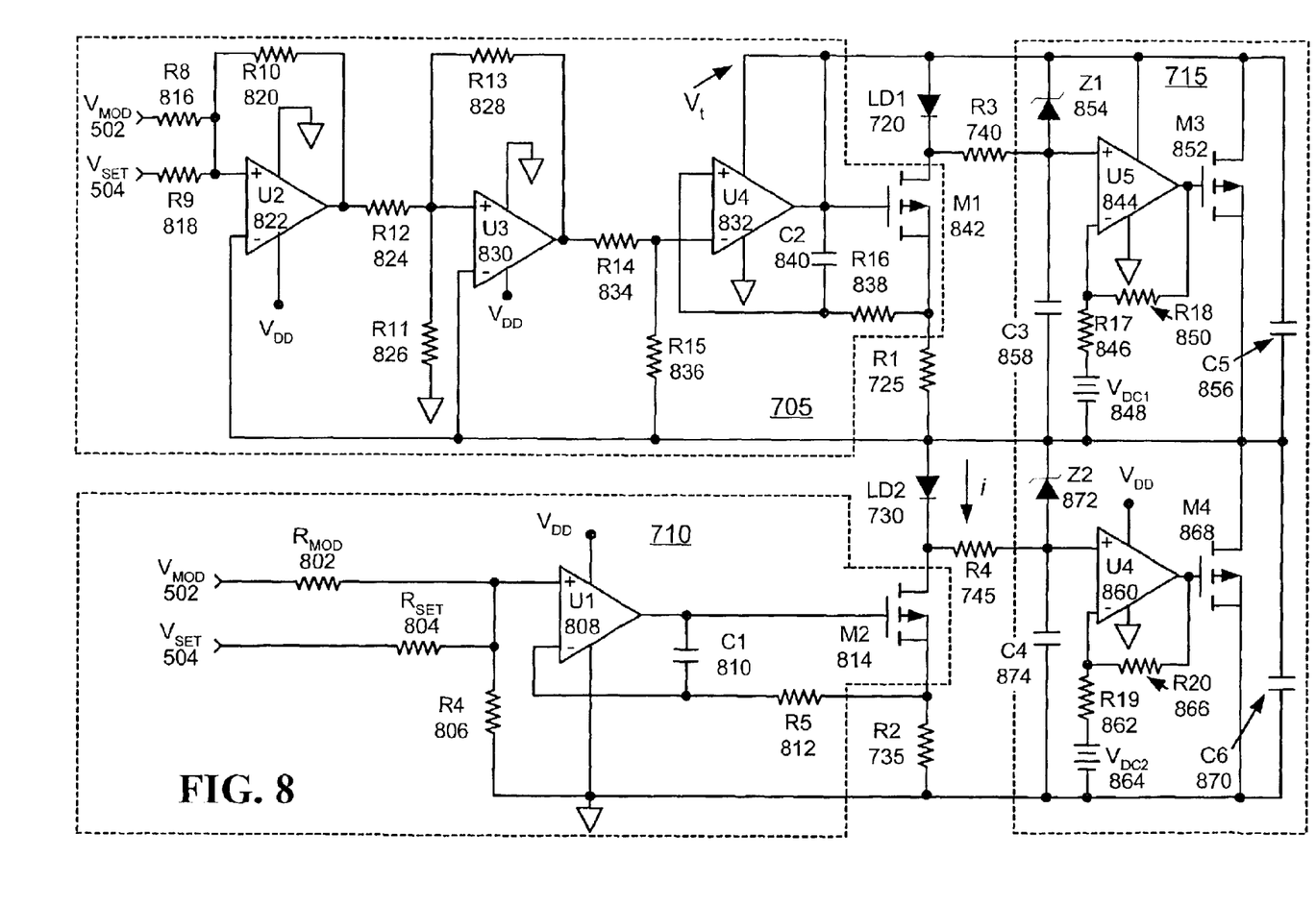
FIG. 8 illustrates exemplary components of the current driver of FIG. 7 consistent with the present invention.

FIG. 8 illustrates exemplary components of current regulators 705 and 710 and adaptive shunt regulator 715 of current driver 635 according to an implementation consistent with the present invention. Current driver 635 includes voltage inputs $V_{MOD}$ 502 and $V_{SET}$ 504 that provide voltages to current regulators 705 and 710. Voltage input $V_{MOD}$ 502 provides the excitation voltage for modulating the current supplied to laser diodes LD1 720 and LD2 730 and, thus, modulating the laser diode optical output. Voltage input $V_{SET}$ 504 sets a nominal current through laser diodes LD1 720 and LD2 730. Values for $V_{SET}$ 504 can, for example, be received by line unit 225 from one of the land terminals 220, e.g., via a supervisory channel, to set the baseline output for a given laser diode. Likewise, values for $V_{MOD}$ 502 can be set to modulate the pump laser power in order to send information to the land terminals 220, e.g., in response to a command therefrom to measure the actual output laser power of a laser diode. Exemplary methods and systems for providing such supervisory signaling can be found in commonly-assigned, co-pending U.S. patent application Ser. No. 09/927,439, entitled "Redundant Line Unit Monitoring Architecture," to John Mellert et al., filed on Aug. 13, 2001, the disclosure of which is incorporated herein by reference.

Voltages $V_{MOD}$ 502 and $V_{SET}$ 504, when applied to current regulator 710, can be divided across a divider network that includes resistors $R_{MOD}$ 802, $R_{SET}$ 804, and R4 806. The output of the divider network may be applied to a controlled feedback amplifier that may include op-amp U1 808, capacitor C1 810, and resistor R5 812. The output of the controlled feedback amplifier may control p-channel MOSFET transistor M2 814, which in turn, can set a nominal current level through laser diode LD2 730.

Voltages $V_{MOD}$ 502 and $V_{SET}$ 504 may, in current regulator 705, be applied to a series of amplifiers that control p-channel MOSFET transistor M1 842 based on feedback voltages measured at either side of resistor R1 725. The series of amplifiers may include a first amplifier that includes op-amp U2 822 and resistors R8 816, R9 818, and R10 820; a second amplifier that includes op-amp U3 830 and resistors R11 826, R12 824 and R13 828; and a third amplifier that includes op-amp U4 832, resistors R14 834, R15 836, R16 838 and capacitor C2 840. The output of the last amplifier of the series can be applied to the gate of transistor M1 842 to set a nominal current level through laser diode LD1 720.

As either of the voltages $V_{MOD}$ 502 or $V_{SET}$ 504 increase (with the other voltage held constant), the output of the series of amplifiers will turn on transistors M1 842 and M2 814, thus, increasing the current through laser diodes LD1 720 and LD2 730. As either of the voltages $V_{MOD}$ 502 or $V_{SET}$ 504 decrease (with the other voltage held constant), the output of the series of amplifiers will turn off transistors M1 842 and M2 814, thus, decreasing the current through laser diode LD1 720 and LD2 730.

Shunt regulator 715 may adaptively adjust the voltage supplied to current regulator 705. An amplifier, that may include op-amp U5 844, resistor R17 846, resistor R18 850, and DC voltage $V_{DC1}$ 848, may control the conduction state of MOSFET M3 852. DC voltage $V_{DC1}$ 848, in conjunction with resistors R17 846 and resistor R18 850, provides a reference voltage level to one input of op-amp U5 844. Op-amp U5 844 compares the voltage supplied via resistor R3 720 to this reference voltage level. If the supplied voltage is greater than the reference voltage level, op-amp U5 844 may turn MOSFET M3 852 on, thus the voltage applied to current regulator 705 decreases. If the supplied voltage is less than the reference voltage level, op-amp U5 844 may turn MOSFET M3 852 off, thus, increasing the voltage supplied to current regulator 705.

Another amplifier, that may include op-amp U4 860, resistor R19 862, resistor R20 866 and DC voltage $V_{DC2}$ 864, may further control the conduction state of MOSFET M4 868. DC voltage VDC2 854, in conjunction with resistors R19 862 and resistor R20 866, provide a reference voltage level to one input of op-amp U4 860. Op-amp U4 860 compares the voltage supplied via resistor R4 745 to this reference voltage level. If the supplied voltage is greater than the reference voltage level, op-amp U4 860 may turn MOSFET M4 868 on, thus, reducing the voltage supplied to current regulator 710. If the supplied voltage is less than the reference voltage level, MOSFET M4 868 may be turned off, thus, increasing the voltage supplied to current regulator 710.

CONCLUSION

Systems and methods consistent with the present invention provide mechanisms that can adjust the supply of current to at least one laser diode of a series coupled laser diode pair by selectively diverting the current to a circuit path that may be connected in parallel to the at least one laser diode. Systems and methods consistent with the present invention may further adaptively control the voltage level of a power supply that powers both of the series coupled laser diodes. The controlled power supply, thus, may supply only the minimum amount of voltage necessary to obtain a given optical output from the laser diodes. Overall power consumption of the current drivers driving the laser system laser diodes may, thus, be reduced.

The foregoing description of exemplary embodiments of the present invention provides illustration and description, but is not intended to be exhaustive or to limit the invention to the precise form disclosed. Modifications and variations are possible in light of the above teachings or may be acquired from practice of the invention. For example, the exemplary current driver described above may be employed in any type of optical transmitter or amplifier that uses laser diodes, including, but not limited to, land terminal 220 shown in FIG. 2.

No element, act, or instruction used in the description of the present application should be construed as critical or essential to the invention unless explicitly described as such. Also, as used herein, the article "a" is intended to include one or more items. Where only one item is intended, the term "one" or similar language is used. The scope of the invention is defined by the following claims and their equivalents.

What is claimed is:

1. A laser system, comprising:
   a first circuit path comprising first and second laser diodes coupled in series; and
   a power supply connected in parallel to the first circuit path and configured to adaptively adjust a first voltage across the first circuit path based on a second voltage received via a first resistor connected to the second laser diode, wherein the second voltage is related to a current flowing through at least one of the first and second laser diodes.

2. The system of claim 1, further comprising:
   a current regulator configured to control a nominal current through the first and second laser diodes.

3. The system of claim 1, further comprising:
   a transistor pair configured to selectively divert current away from the first laser diode through a second circuit path coupled in parallel with the first laser diode, wherein the transistors of the transistor pair are connected sate to gate.

4. The system of claim 2, the current regulator comprising:
   a transistor and a second resistor coupled in series with the first and second laser diodes.

5. The system of claim 4, the current regulator further comprising:
   an amplifier coupled to the transistor.

6. The system of claim 3, wherein the gate-to-gate connection between the transistors of the transistor pair comprises a substantially zero resistance connection between the gates of the transistors.

7. A laser system, comprising:
   a power supply configured to supply current to a first laser diode;
   a first circuit path comprising the first laser diode; and
   a transistor pair configured to selectively divert a portion of current from the first circuit path through at least one transistor of the transistor pair to decrease the supply of current to the first laser diode, wherein the transistors of the transistor pair are connected gate-to-gate.

8. The system of claim 7, wherein the second circuit path is coupled in parallel to the first circuit path.

9. The system of claim 7, wherein the transistor pair comprises connected FET transistors.

10. The system of claim 9, wherein the FET transistors are connected source to drain.

11. The system of claim 7, further comprising:
    at least one amplifier configured to control a conduction state of the transistor pair.

12. The system of claim 11, wherein the at least one amplifier is further configured to control the conduction state based on one or more feedback voltages derived from the first circuit path.

13. The system of claim 7, further comprising:
    a third circuit path coupled in series with the first circuit path, the third circuit path comprising a second laser diode.

14. The system of claim 7, wherein the gate-to-gate connection between the transistors of the transistor pair comprises a substantially zero resistance connection between the gates of the transistors.

15. A laser system, comprising:
    a first circuit path comprising a series coupled laser diode pair;
    a first current regulator configured to control current supplied to the laser diode pair;
    a second current regulator configured to selectively divert a portion of the supplied current away from a first laser diode of the laser diode pair; and
    a power supply connected in parallel to the first circuit path and configured to adaptively adjust a level of a supply voltage applied across the first circuit path based on a second voltage received via a first resistor connected to one of the laser diodes of the laser diode pair, wherein the second voltage is related to the supplied current flowing through the laser diode pair.

16. The system of claim 15, wherein the second current regulator selectively diverts the portion of the supplied current to a second circuit path coupled in parallel with the first laser diode.

17. The system of claim 16, wherein the second circuit path comprises a transistor pair.

18. The system of claim 17, wherein the transistor pair comprises coupled FET transistors.

19. The system of claim 18, wherein the FET transistors are coupled source to drain and gate to gate.

20. A method of powering a laser system, comprising:
applying a supply voltage in parallel across a first circuit path comprising first and second series coupled laser diodes; and
adaptively adjusting a level of the supply voltage based on a second voltage received via a first resistor connected to the second laser diode, wherein the second voltage is related to a current flowing through at least one of the first and second series coupled laser diodes.

21. The method of claim 20, further comprising:
selectively diverting current away from the first laser diode through a second circuit path coupled in parallel to the first laser diode to decrease the supply of current to the first laser diode.

22. The method of claim 20, further comprising:
controlling a transistor coupled in series with the first and second laser diodes so as to set a nominal current through the first and second laser diodes.

23. A method of powering a laser system, comprising:
supplying a current to a first circuit path comprising a laser diode; and
selectively diverting a portion of the current from the first circuit path through at least one transistor of a transistor pair to decrease the current supplied to the laser diode, wherein the transistors of the transistor pair are connected gate-to-gate.

24. The method of claim 23, wherein the second circuit path is coupled in parallel with the first circuit path.

25. The method of claim 23, further comprising:
selectively diverting the portion of the current from the first circuit path through the at least one transistor of the transistor pair based on at least one voltage measured in the first circuit path.

26. The method of claim 23, further comprising:
selectively diverting the portion of the current from the first circuit path through that at least one transistor of the transistor pair based on a voltage input specifying a nominal level of the current.

27. The method of claim 23, further comprising:
selectively diverting the portion of the current from the first circuit path to the second circuit path based on a voltage input that modulates an output level of the first and second laser diodes.

28. The method of claim 23, wherein the gate-to-gate connection between the transistors of the transistor pair comprises a substantially zero resistance connection between the gates of the transistors.

29. A laser system, comprising:
means for supplying a current to a first circuit path comprising a laser diode; and
means for selectively diverting a portion of the current from the first circuit path through at least one transistor of a transistor pair to decrease the current supplied to the laser diode, wherein the transistors of the transistor pair are connected gate-to-gate, wherein the gate-to-gate connection between the transistors of the transistor pair comprises a substantially zero resistance connection.

30. A repeater comprising:
a plurality of pump lasers for providing pump energy to a gain medium;
a plurality of first inputs, each associated with a respective one of said plurality of pump lasers, wherein each of said plurality of inputs provides a value associated with an intended optical output power for its respective pump laser;
a plurality of driver circuits, each associated with a respective one of said plurality of inputs and pump lasers, each for supplying current to its respective pump laser;
wherein said current supplied to a respective pump laser varies based upon both said value and an efficiency of said respective pump laser.

31. The repeater of claim 30, further comprising:
a plurality of second inputs, each associated with a respective one of said plurality of pump lasers, wherein each of said plurality of second inputs provides a value associated with an intended modulation for its respective pump laser.

32. The repeater of claim 30, wherein said plurality of pump lasers are laser diodes.

33. The repeater of claim 32, wherein pairs of said laser diodes are connected together in series.

34. A laser system comprising:
a first circuit path comprising a laser diode and a resistor;
a second circuit path comprising a transistor pair, wherein a first transistor of the transistor pair is connected source to drain and gate to gate with a second transistor of the transistor pair; and
at least one amplifier connected to the gates of the first and second transistors, the at least one amplifier configured to apply a first voltage to the gates of the first and second transistors to selectively divert current from the first circuit path through at least the first transistor, wherein the first voltage is based on a feedback voltage applied to the at least one amplifier that is measured at the resistor.

35. The laser system of claim 34, wherein the at least one amplifier comprises a series of amplifiers, where each amplifier of the series of amplifiers comprises an operational amplifier (op-amp).

36. The laser system of claim 35, wherein the first voltage is further based on at least one control voltage, wherein the at least one control voltage is input into the series of amplifiers.

37. The laser system of claim 36, wherein the at least one control voltage comprises a first control voltage and a second control voltage, wherein the first control voltage sets a nominal current through the laser diode and wherein the second control voltage modulates a current through the laser diode to modulate an optical output of the laser diode.

38. A system, comprising:
a first transistor connected in series with a diode and a first resistor, the first transistor controlling a nominal current through the diode and the first resistor;
a transistor pair, connected gate-to-gate, that selectively diverts at least a portion of the nominal current through one transistor of the transistor pair; and
a plurality of amplifiers that control a conduction state of the transistor pair, wherein the plurality of amplifiers control the conduction state based, at least in part, on a first voltage measured at the first resistor.

39. The system of claim 38, further comprising:
a second resistor connected to a source of the first transistor; and an adaptive power supply that adjusts a supply voltage across the series connected diode, first transistor and first resistor based on a voltage measured at the second resistor.

40. The system of claim 38, wherein the first resistor is connected in series between the diode and the first transistor.

41. The system of claim 38, wherein the plurality of amplifiers further control the conduction state of the transistor pair based on at least one control voltage applied to at least one amplifier of the plurality of amplifiers.

42. The method of claim 38, wherein the gate-to-gate connection between the transistors of the transistor pair comprises a substantially zero resistance connection between the gates of the transistors.

* * * * *